(12) United States Patent
Ogawa et al.

(10) Patent No.: US 7,510,669 B2
(45) Date of Patent: Mar. 31, 2009

(54) PIEZOELECTRIC CERAMIC COMPOSITION AND PIEZOELECTRIC COMPONENT

(75) Inventors: Hirozumi Ogawa, Yasu-gun (JP); Masahiko Kimura, Kusatsu (JP); Kosuke Shiratsuyu, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/054,060

(22) Filed: Mar. 24, 2008

(65) Prior Publication Data
US 2008/0169445 A1     Jul. 17, 2008

Related U.S. Application Data

(63) Continuation of application No. PCT/JP2006/313231, filed on Jul. 3, 2006.

(30) Foreign Application Priority Data
Sep. 30, 2005    (JP) .............................. 2005-289315

(51) Int. Cl.
*C04B 35/495* (2006.01)
*H01B 3/12* (2006.01)
*H01L 41/187* (2006.01)

(52) U.S. Cl. .................. 252/62.9 R; 501/134; 501/135; 310/311

(58) Field of Classification Search ............ 252/62.9 R, 252/62.9 PZ; 501/134, 135; 310/311
See application file for complete search history.

(56) References Cited

U.S. PATENT DOCUMENTS 6,117,354 A * 9/2000 Kimura et al. .......... 252/62.9 R

FOREIGN PATENT DOCUMENTS

| JP | 8-153854 | 6/1996 |
|----|----------|--------|
| JP | 8-249876 | 9/1996 |
| JP | 10-338599 | 12/1998 |
| JP | 11-322426 | 11/1999 |
| JP | 2001-335362 | * 12/2001 |
| JP | 2002-47062 | 2/2002 |
| JP | 2002-154871 | 5/2002 |
| JP | 2003-119076 | 4/2003 |
| JP | 2004-130188 | 4/2004 |

OTHER PUBLICATIONS

Translation for JP 2001-335362.*

* cited by examiner

*Primary Examiner*—C. Melissa Koslow

(74) *Attorney, Agent, or Firm*—Dickstein Shapiro LLP

(57) ABSTRACT

A piezoelectric ceramic composition includes a bismuth layer compound containing at least Sr, Bi and Nb, e.g., $(Sr_{0.9}Nd_{0.1})Bi_2Nb_2O_9$, as a main component and 2 parts by weight or less (excluding 0 part by weight), preferably 0.04 part by weight to 0.5 part by weight, of Cu in terms of CuO relative to 100 parts by weight of the main component. From the viewpoint of improvement in sinterability, 0.1 part by weight to 2 parts by weight of Mn in terms of $MnCO_3$ relative to 100 parts by weight of the main component is preferably contained. As a result, it is possible to obtain a piezoelectric ceramic composition resisting no deterioration in piezoelectricity even when a rapid temperature change occurs, and an advantageous piezoelectric component, such as a piezoelectric actuator or a piezoelectric resonator, manufactured using the piezoelectric ceramic composition.

20 Claims, 3 Drawing Sheets

FIG. 3
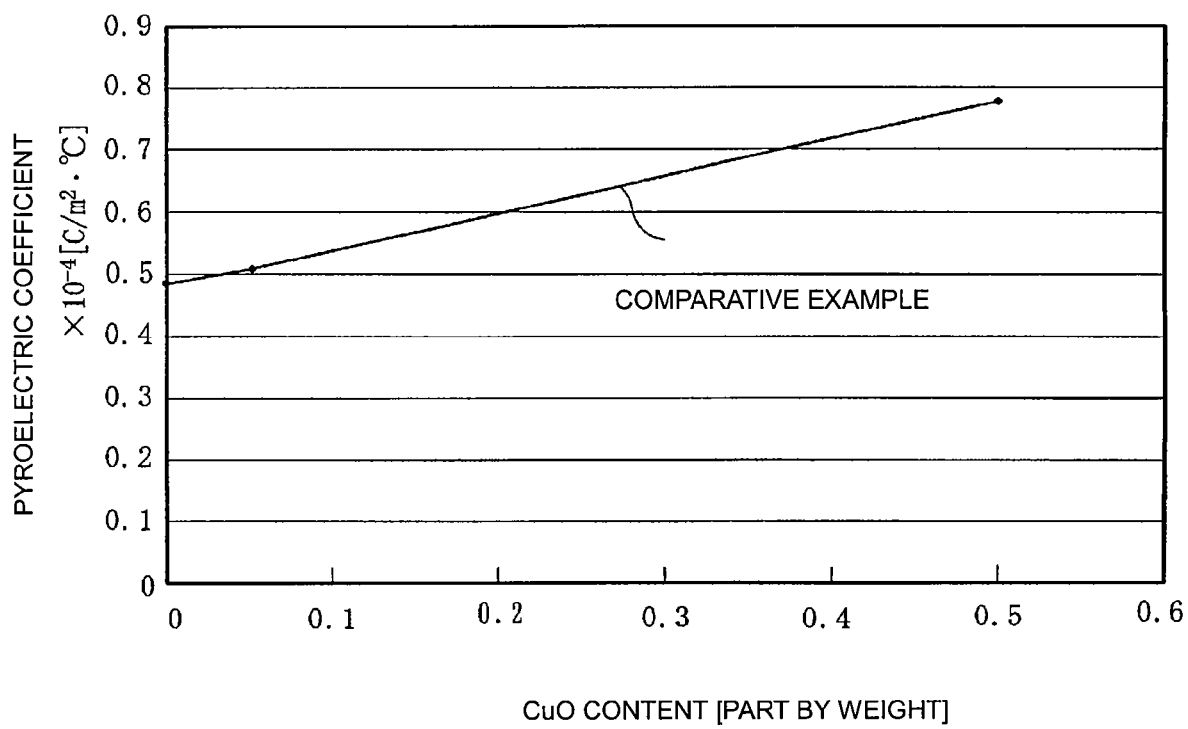
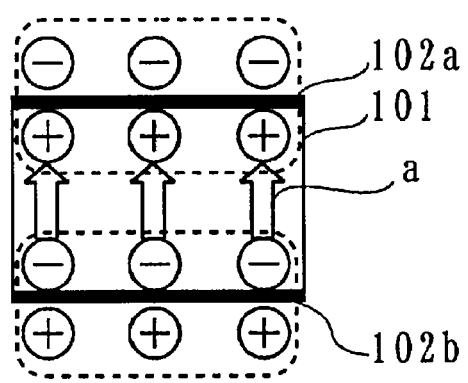
FIG. 4 (PRIOR ART)

PIEZOELECTRIC CERAMIC COMPOSITION AND PIEZOELECTRIC COMPONENT

This is a continuation of application Ser. No. PCT/JP2006/313231, filed Jul. 3, 2006.

TECHNICAL FIELD

The present invention relates to a piezoelectric ceramic composition and a piezoelectric component, and more specifically to a lead-free piezoelectric ceramic composition containing a bismuth layer compound as a main component and a piezoelectric component, such as a piezoelectric resonator, a piezoelectric actuator or the like, using the piezoelectric ceramic composition.

BACKGROUND ART

There has recently been a demand for developing a piezoelectric material which does not contain lead in consideration of the environment. Under this condition, a piezoelectric ceramic composition containing a bismuth layer compound as a main component has attracted attention, and a SrBiNbO piezoelectric ceramic composition (referred to as a "SBN-type piezoelectric ceramic composition" hereinafter) containing Sr, Bi and Nb as main components has been vigorously researched and developed.

As the SBN-type piezoelectric ceramic composition, for example, a piezoelectric ceramic composition represented by the general formula, $Bi_2(Sr_{1-x}M_x)Nb_2O_9$ (wherein M is a divalent metal element and $0 \leq x \leq 0.3$), and containing 1.0 part by weight or less (excluding 0) of Mn in terms of $MnCO_3$ has been proposed (Patent Document 1).

Patent Document 1: Japanese Unexamined Patent Application Publication No. H11-322426

DISCLOSURE OF INVENTION

Problems to be Solved by the Invention

However, the SBN-type piezoelectric ceramic composition disclosed in Patent Document 1 has a relatively high pyroelectric coefficient, a value used as an index for the pyroelectric function of bismuth layer compounds. Therefore, the composition has a problem that when a rapid temperature change occurs, the composition is easily depolarized by the influence of a change in remanent polarization value to cause deterioration in piezoelectric characteristics.

That is, as shown in FIG. 4, a piezoelectric component such as a piezoelectric actuator or a piezoelectric resonator includes electrodes 102a and 102b formed on both main surfaces of a piezoelectric ceramic substrate 101. When the piezoelectric ceramic substrate 101 is composed of a SBN-type piezoelectric ceramic composition, polarization occurs in the direction of arrow a to produce remanent polarization in the direction of arrow a. Therefore, under normal conditions, free ions are adsorbed on the surfaces of the piezoelectric ceramic substrate 101 so as to neutralize the surfaces, and thus the surfaces of the piezoelectric ceramic substrate 101 are brought into an electrically neutral state.

However, when the temperature is rapidly changed from a high temperature to a low temperature, the spontaneous polarization is increased by the pyroelectric characteristic to increase the amount of charge (positive charge or negative charge) formed on both main surfaces as shown in FIG. 5. The increased charge is not neutralized by ions in the air to form surface charge (pyroelectric charge). This charge produces an electric field in the direction shown by arrows b (which is opposite to the polarization direction (arrow a)) causing polarization to be decreased, thereby causing depolarization. As a result, the piezoelectric component is driven under a condition in which polarization is not sufficiently performed, thereby failing to obtain sufficient piezoelectric characteristics.

A SBN-type piezoelectric ceramic composition as such disclosed in Patent Document 1 has the problem of degrading piezoelectric characteristics when a rapid temperature change occurs.

On the other hand, the above-mentioned SBN-type piezoelectric ceramic composition is a pyroelectric material which has a relatively high pyroelectric coefficient and is easily affected by the remanent polarization produced by a rapid temperature change. However, since the composition has a low rate of change in resonance frequency with temperature and thus has stable temperature characteristics, it is a piezoelectric material suitable for increasing the precision of piezoelectric components such as a piezoelectric resonator and a piezoelectric actuator.

The present invention has been achieved in consideration of the above situation, and an object of the present invention is to provide a piezoelectric ceramic composition which resists deterioration in piezoelectricity even when a rapid temperature change occurs, and provide a piezoelectric component manufactured using the piezoelectric ceramic composition, such as a piezoelectric actuator or a piezoelectric resonator.

Means for Solving the Problems

As a result of intensive research for achieving the object with attention to a SBN-type piezoelectric ceramic composition, the inventors have found that when a Cu compound is added to a SBN-type bismuth layer compound containing at least Sr, Bi and Nb as a main component so that the Cu content in terms of CuO is 2 parts by weight relative to 100 parts by weight of the main component, it is possible to suppress the pyroelectric characteristic while maintaining piezoelectric characteristics at a practicable level, thereby avoiding as much as possible the influence of remanent polarization and preventing depolarization even when a rapid temperature change occurs.

The present invention has been achieved on the basis of the finding, and a piezoelectric ceramic composition according to the present invention includes a bismuth layer compound containing at least Sr, Bi and Nb as a main component and 2 parts by weight or less (excluding 0 part by weight) of Cu in terms of CuO relative to 100 parts by weight of the main component.

In particular, when the Cu content in terms of CuO is in the range of 0.04 part by weight to 0.5 part by weight, the pyroelectric function can be effectively suppressed.

In the piezoelectric ceramic composition of the present invention, the main component is preferably represented by the composition formula $SrBi_2Nb_2O_9$.

Further, the Sr is partially substituted by at least one type of metal element selected from monovalent, divalent and trivalent metal elements in a piezoelectric ceramic composition of the present invention.

Further, Nb is partially substituted by Ta in a preferable piezoelectric ceramic composition of the present invention.

A general formula allowing for the Sr and Nb substitution is $Bi_2(Sr_{1-x}M_x)(Nb_{2-y}Ta_y)O_9$ in which M is a monovalent, divalent or trivalent metal, or a combination thereof, $0 \leq x \leq 0.3$ and $y \leq 0.1$.

Further, the piezoelectric ceramic composition of the present invention preferably contains 0.1 part by weight to 2 parts by weight of Mn in terms of $MnCO_3$ relative to 100 parts by weight of the main component.

A piezoelectric component according to the present invention includes electrodes formed on both main surfaces of a ceramic substrate, the ceramic substrate being made of the above-described piezoelectric ceramic composition.

Advantages

A piezoelectric ceramic composition according to the present invention includes a bismuth layer compound containing at least Sr, Bi and Nb as a main component and 2 parts by weight or less (excluding 0 part by weight) of Cu in terms of CuO relative to 100 parts by weight of the main component. Therefore, it is possible to suppress the pyroelectric function and thus prevent depolarization due to a change in remanent polarization. Thus, a piezoelectric ceramic composition resisting deterioration in piezoelectricity even when a rapid temperature change occurs can be obtained.

Further, when 0.04 part by weight to 0.5 part by weight of Cu in terms of CuO is contained relative to 100 parts by weight of the main component, a piezoelectric ceramic composition capable of securely decreasing the pyroelectric function with substantially no deterioration in the piezoelectric constant can be realized.

A piezoelectric ceramic composition according to the present invention can be applied to a case in which a SBN-type bismuth layer compound is the main component. A composition represented by the composition formula $SrBi_2Nb_2O_9$, a composition in which Sr in the composition formula is partially substituted by at least one type of metal element selected from monovalent, divalent and trivalent metal elements, and a composition in which Nb in the composition formula is partially substituted by Ta can exhibit the same operation and effect.

Further, when 0.1 part by weight to 2 parts by weight of Mn in terms of $MnCO_3$ is present relative to 100 parts by weight of the main component, sinterability can be improved.

A piezoelectric component according to the present invention includes electrodes formed on both main surfaces of a ceramic substrate, the ceramic substrate being made of the above-described piezoelectric ceramic composition. Therefore, a piezoelectric component resisting deterioration in piezoelectricity even when a rapid temperature change occurs can be obtained.

BRIEF DESCRIPTION OF DRAWINGS

FIG. 3 is a characteristic diagram showing a relation between the CuO content and pyroelectric coefficient in Comparative Example.

FIG. 4 is a drawing schematically showing a normal charge distribution of a pyroelectric material.

REFERENCE NUMERALS

Figure 1:
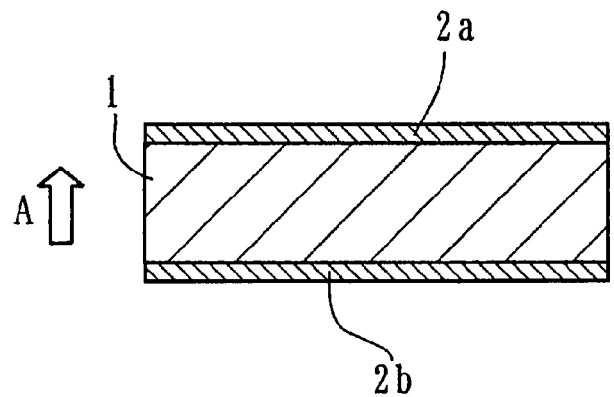
FIG. 1 is a sectional view of a piezoelectric component manufactured using a piezoelectric ceramic composition according to an embodiment of the present invention.

1 piezoelectric ceramic substrate
2a, 2b electrode

BEST MODE FOR CARRYING OUT THE INVENTION

A piezoelectric ceramic composition according to the present invention includes a bismuth layer compound containing at least Sr, Bi and Nb, for example, $SrBi_2Nb_2O_9$, as a main component and 2 parts by weight or less (excluding 0 part by weight) of Cu in terms of CuO relative to 100 parts by weight of the main component.

Namely, as described in "Problem to be Solved by the Invention", a SBN-type piezoelectric ceramic composition such as those represented by $SrBi_2Nb_2O_9$ has a high pyroelectric coefficient and undergoes spontaneous polarization and thus produces depolarization by the influence of remanent polarization to decrease piezoelectricity when a rapid temperature change occurs.

As a result of intensive research on the above-mentioned problem, the inventors have found that when a Cu compound is added to a SBN-type bismuth layer compound containing at least Sr, Bi and Nb as a main component so that the Cu content in terms of CuO is 2 parts by weight or less (excluding 0 part by weight) relative to 100 parts by weight of the main component, it is possible to decrease the pyroelectric coefficient Tp, thereby avoiding deterioration in piezoelectricity even when a rapid temperature change occurs.

The reason for determining the Cu content to 2 parts by weight or less (excluding 0 part by weight) is the following:

Although the pyroelectric coefficient Tp is rapidly decreased by adding the Cu compound to the SBN-type bismuth layer compound, the piezoelectric constant is rapidly decreased when the Cu content exceeds 2 parts by weight in terms of CuO. Consequently, a piezoelectric function is not exhibited, and practicability as a piezoelectric component may be degraded.

Therefore, the Cu content is controlled to 2 parts by weight or less in terms of CuO in an embodiment of the present invention.

In order to sufficiently exhibit the function to decrease the pyroelectric coefficient Tp and achieve an excellent piezoelectric constant, the Cu content is preferably controlled to 0.04 part by weight to 0.5 part by weight in terms of CuO.

The estimated reason why the pyroelectric coefficient Tp is decreased by adding Cu is that there is some kind of action between the SBN-type piezoelectric ceramic composition and Cu.

For example, a SrBiTiO piezoelectric ceramic composition (referred to as a "SBTi-type piezoelectric ceramic composition" hereinafter) containing Sr, Bi and Ti as main components is known as a piezoelectric ceramic composition containing a bismuth layer compound as a main component (for example, Japanese Unexamined Patent Application Publication No. 2002-47062, 2002-154872, and 2004-189507, etc.). The results of experiments performed by the inventors indicate that when Cu is contained in the SBTi-type piezoelectric ceramic composition, the pyroelectric coefficient Tp is rather increased. Therefore, it is thought that the SBN-type piezoelectric ceramic composition containing Sr, Bi and Nb as main components has some kind of action between Cu the SBN-type piezoelectric ceramic composition, thereby contributing to a decrease in the pyroelectric coefficient Tp.

Therefore, when 2 parts by weight or less (excluding 0 part by weight), preferably 0.04 part by weight to 0.5 part by weight, of Cu in terms of CuO is contained in the SBN-type bismuth layer compound, the pyroelectric coefficient Tp can be decreased while a high piezoelectric constant is maintained. As a result, the change in remanent polarization with a temperature change is decreased and decreases the electric field in the direction in which spontaneous polarization caused by a temperature change or a thermal impact is weakened, thereby preventing depolarization and suppressing a decrease in piezoelectricity in association with a temperature change.

The form of Cu present in the piezoelectric ceramic composition is not particularly limited, and Cu may be present in any form, for example, the form of a complete solid solution in the bismuth layer compound, a partial solid solution in the bismuth layer compound, or a form in which Cu is present at crystal grain boundaries.

Further, a typical example of the SBN-type bismuth layer compound is the above-described $SrBi_2Nb_2O_9$. However, even when Sr in the $SrBi_2Nb_2O_9$ is partially substituted by at least one type of metal element selected from monovalent metal elements (Na, K and Li), divalent metal elements (Ca and Ba), and trivalent metal elements (Nd, Dy, Bi and La), the same operation and effect can be exhibited. Even when Nb is partially substituted by Ta, the same operation and effect can be exhibited. However, when Nb is partially substituted by Ta, the molar amount of substitution is preferably a molar ratio of 0.1 mol or less. This is because when the molar amount of substitution exceeds 0.1 mol, the Curie temperature may be decreased to fail to secure desired piezoelectric performance.

It is also preferred that the piezoelectric ceramic composition contains Mn as a sintering additive. Namely, sinterability can be improved by adding Mn, thereby decreasing the sintering temperature. As a result, the wearing of a casing (sagger) used for firing can be suppressed, and energy necessary for attaining the maximum firing temperature can be decreased.

The Mn content is preferably 0.1 part by weight to 2 parts by weight in terms of $MnCO_3$ relative to 100 parts by weight of the main component. This is because when the Mn content is less than 0.1 part by weight in terms of $MnCO_3$, the function as the sintering additive is not sufficient exhibited because of an excessively low content, while when the Mn content exceeds 2 parts by weight in terms of $MnCO_3$ relative to 100 parts by weight of the main component, insulation resistance may be decreased to fail to achieve desired polarization.

FIG. 1 is a sectional view of a piezoelectric component manufactured using the above-described piezoelectric ceramic composition according to an embodiment of the present invention. The piezoelectric component includes a piezoelectric ceramic substrate 1 composed of the above-described piezoelectric ceramic composition of the present invention, and electrodes 2a and 2b formed on both main surfaces of the piezoelectric ceramic substrate 1 and composed of a conductive material such as Ag as a main component, polarization being performed in a direction of arrow A.

The piezoelectric component can be easily produced, for example, as follows:

Namely, predetermined amounts of $SrCO_3$, $Bi_2O_3$ and $Nb_2O_5$, and, if required, $Nd_2O_3$ and $Ta_2O_5$ are weighed as raw materials constituting a main component composition. Further, if required, a Mn compound is weighed as a sintering additive so that the Mn content is 0.1 part by weight to 2 parts by weight in terms of $MnCO_3$ relative to 100 parts by weight of the main component. The weighed materials are poured into a ball mill together with a milling medium and water, mixed, and wet-milled. Then, after dehydration and drying, the mixture is calcined at a predetermined temperature (e.g., about 800° C. to 1000° C.) to form a calcined product.

Next, a Cu compound is added to the calcined product so that the Cu content is 2 parts by weight or less, preferably 0.04 part by weight to 0.5 part by weight, in terms of CuO relative to 100 parts by weight of the main component. Further, an organic binder, a dispersant, and water are mixed in the ball mill containing a milling medium, and the resultant mixture is again wet-milled, dehydrated, dried, and then formed in a predetermined shape by pressing to obtain a ceramic molded product.

Then, after the binder is removed from the ceramic molded product at a temperature of about 400° C. to 600° C., the product is placed in a closed casing (sagger) and fired at a temperature of about 1000° C. to 1200° C. to form a ceramic sintered product. Both main surfaces of the ceramic sintered product are polished to form the piezoelectric ceramic substrate 1. Then, the electrodes 2a and 2b are formed on both main surfaces of the piezoelectric ceramic substrate 1 by any method such as a thin film formation method, e.g., sputtering or vapor deposition, plating, or electrode paste baking.

Next, polarization is performed by applying a predetermined electric field in silicone oil heated to a predetermined temperature to produce a piezoelectric component.

Since the piezoelectric component is produced using the piezoelectric ceramic composition of the present invention, the pyroelectric coefficient Tp can be decreased while the piezoelectric constant is maintained at a practicable level. Therefore, depolarization little occurs even when a rapid temperature change occurs, and a desired piezoelectricity can be maintained even when the rapid temperature change occurs. As a result, a piezoelectric component suitable for use as a piezoelectric resonator and a piezoelectric actuator can be provided.

The present invention is not limited to the above-described embodiment.

A single-plate type as shown in FIG. 1 is suitable as a structure of the piezoelectric component. In other words, in a multilayer piezoelectric component including an internal electrode, even when spontaneous polarization is increased by a temperature change, for example, the negative charge is increased on the upper surface of the internal electrode, and a positive charge is increase on the lower surface of the internal electrode. As a result, little remanent polarization occurs due to neutralization by the positive and negative charges produced on the upper and lower surfaces of the internal electrode. In a single-plate piezoelectric component, remanent polarization is formed in the SBN-type piezoelectric ceramic composition not containing Cu because of the absence of an internal electrode, and depolarization easily occurs due to the influence of the remanent polarization.

Therefore, the piezoelectric ceramic composition of the present invention is suitable for application to single-plate piezoelectric components.

EXAMPLE

Next, an example of the present invention and a comparative example are described in detail below.

Example 1

First, $SrCO_3$, $Nd_2O_3$, $Bi_2O_3$ and $Nb_2O_5$ were weighed so that the main component composition after sintering satisfied the composition formula $(Sr_{0.9}Nd_{0.1})Bi_2Nb_2O_9$. Then, $MnCO_3$ was weighed as a sintering additive so that the content was 0.5 part by weight relative to 100 parts by weight of the main component. The weighed materials were poured together with water into a ball mill containing zirconia balls serving as a milling medium, mixed, and wet-milled. Then, after dehydration and drying, the mixture was calcined at a temperature of 800° C. to 1000° C. to prepare a calcined product.

Next, CuO was appropriately added to the calcined product so that the CuO content in a resultant ceramic sintered product (piezoelectric ceramic composition) was 0 to 2.2 parts by weight relative to 100 parts by weight of the main component. Further, a vinyl acetate organic binder, an acrylic dispersant and water were mixed together with zirconia balls in the ball mill, and the resultant mixture is again wet-milled, dehydrated, and dried to prepare a powder. Then, the resultant powder was formed into a disk shape by pressing to obtain a ceramic molded product having a diameter of 12 mm and a thickness of 1.2 mm.

After the binder was removed from the ceramic molded product at a temperature of 500° C., the product was placed in a closed casing (sagger) and fired at a temperature of 1000° C. to 1200° C. to form a ceramic sintered product. Then, both main surfaces of the ceramic sintered product were polished to a thickness of about 0.5 mm to form a piezoelectric ceramic substrate. Next, electrodes composed of Ag were formed on both main surfaces of the piezoelectric ceramic substrate by sputtering Ag used as a target.

Then, polarization was performed by applying an electric field of 4 to 8 kV/mm for 15 minutes in silicone oil heated to a temperature of 200° C. to produce samples (Sample Nos. 1 to 10) having different CuO contents in the range of 0 to 2.2 parts by weight relative to 100 parts by weight of the main component.

Ten (10) test pieces of each of the samples were prepared and placed in a vessel in which the temperature could be changed at a predetermined rate. The temperature was changed in the range of 10° C. to 70° C. at a rate of change of 0.5° C./s to measure the pyroelectric current I (A (=C/s)), and the pyroelectric coefficient Tp $(C/m^2 \cdot °C.)$ was calculated on the basis of the following equation (1):

$$Tp = I/(S \cdot \Delta t) \quad (1)$$

wherein S represents the area of a main surface calculated from the diameter of a sample using a micrometer, and $\Delta t$ represents the rate of change in temperature per unit time.

Also vibration of 100 Hz was applied between both main surfaces to measure the charge induced on a surface of the piezoelectric material using a $d_{33}$ meter and determine the piezoelectric constant $d_{33}$.

Figure 2:
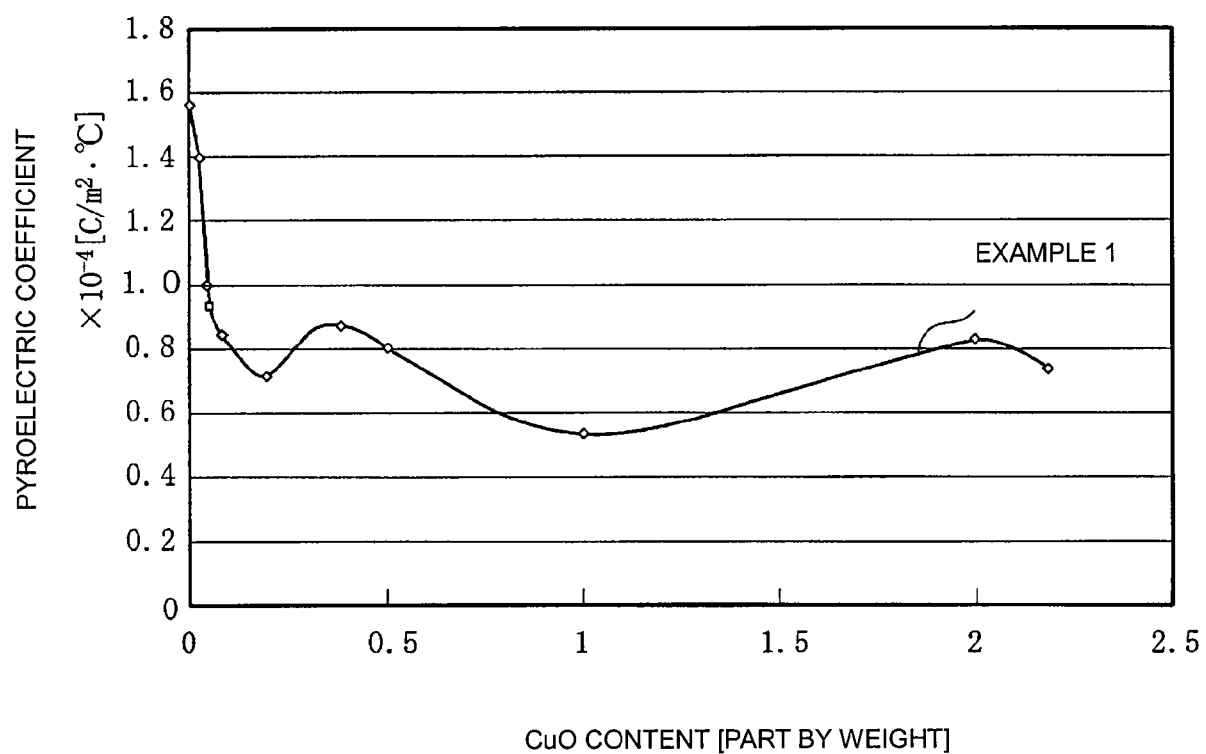
FIG. 2 is a characteristic diagram showing a relation between the CuO content and pyroelectric coefficient in Example 1.
Figure 5:
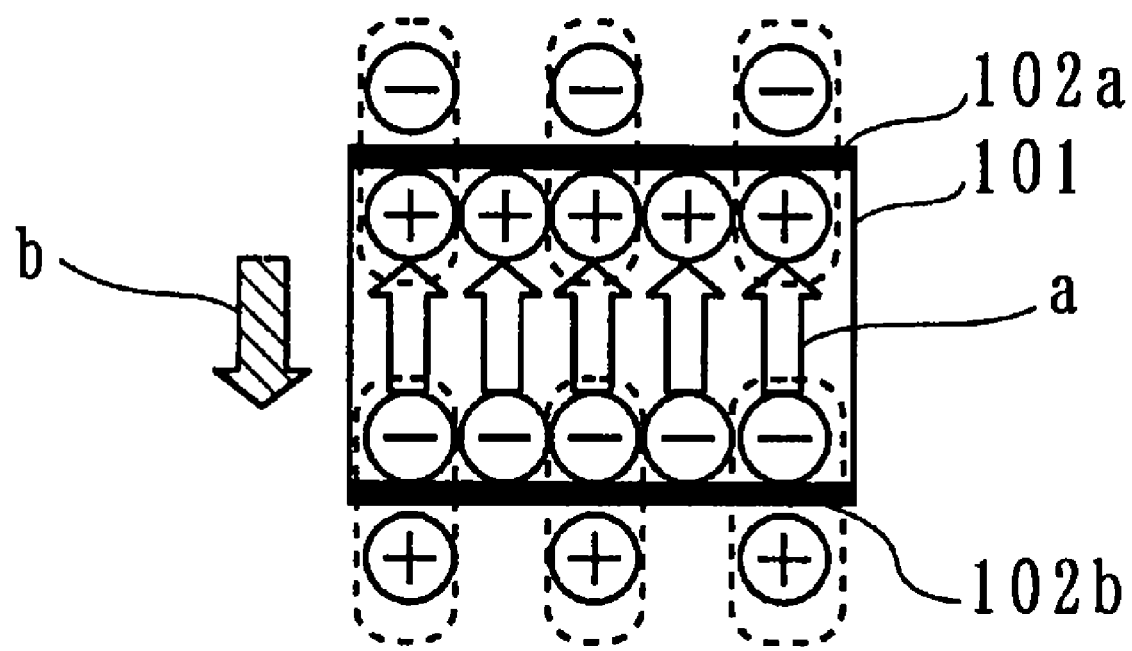
FIG. 5 is a drawing schematically showing a charge distribution when a temperature change occurs in a pyroelectric material.

Table 1 shows the CuO content, pyroelectric coefficient Tp and piezoelectric constant $d_{33}$ of each of the samples of Sample Nos. 1 to 10. FIG. 2 is a plot of a relation between the CuO content and the pyroelectric coefficient Tp.

TABLE 1

| Sample No. | CuO content (part by weight) | Pyroelectric coefficient Tp × 10$^{-4}$ (C/m$^2$ · ° C.) | Piezoelectric constant $d_{33}$ (pC/N) |
|---|---|---|---|
| 1* | 0 | 1.57 | 15 |
| 2 | 0.02 | 1.40 | 15 |
| 3 | 0.04 | 1.00 | 16 |
| 4 | 0.08 | 0.84 | 15 |
| 5 | 0.2 | 0.71 | 15 |
| 6 | 0.4 | 0.87 | 16 |
| 7 | 0.5 | 0.80 | 12 |
| 8 | 1.0 | 0.53 | 8 |
| 9 | 2.0 | 0.82 | 6 |
| 10* | 2.2 | 0.75 | 4 |

*out of the range of the present invention

Main component composition: $(Sr_{0.9}Nd_{0.1})Bi_2Nb_2O_9$

Table 1 and FIG. 2 indicate that when CuO is contained in a piezoelectric ceramic composition containing $(Sr_{0.9}Nd_{0.1})Bi_2Nb_2O_9$ as a main component, the pyroelectric coefficient Tp is rapidly decreased while the piezoelectric constant is maintained at a practicable level.

Namely, the pyroelectric coefficient Tp in Sample No. 1 not containing CuO is as high as $1.57 \times 10^{-4}$ $(C/m^2 \cdot °C.)$, but as in Sample Nos. 2 to 10, the pyroelectric coefficient Tp is decreased by adding CuO. In particular, it is found that as in Sample Nos. 3 to 10 where the CuO content is 0.04 part by weight to 2.0 parts by weight, the pyroelectric coefficient can be suppressed to $1.0 \times 10^{-4}$ $(C/m^2 \cdot °C.)$ or less and can be decreased to about ⅔ of that of Sample No. 1.

However, it is found that as in Sample No. 10, when the CuO content exceeds 2.0 parts by weight, the piezoelectric constant $d_{33}$ is 5 pC/N or less, and thus piezoelectricity is degraded to an impracticable level.

Further, it is found that in particular, when the CuO content is 0.04 part by weight to 0.5 part by weight, the piezoelectric constant $d_{33}$ is 12 pC/N or more and is little decreased as compared with Sample No. 1.

These results reveal that the Cu content in terms of CuO must be 2.0 parts by weight or less and is preferably 0.04 part by weight to 0.5 part by weight, relative to 100 parts by weight of the main component.

Example 2

First, $SrCO_3$, $Bi_2O_3$, $Nb_2O_5$ and $Ta_2O_5$ were weighed so that the main component composition after sintering satisfied the composition formula $SrBi_2(Nb_{1.9}Ta_{0.1})O_9$. Then, $MnCO_3$ was weighed as a sintering additive so that the content was 0.5 part by weight relative to 100 parts by weight of the main component. The weighed materials were poured into a ball mill together with zirconia balls serving as a mill medium and water, mixed, and wet-milled. Then, after dehydration and drying, the mixture was calcined at a predetermined temperature of 800° C. to 1000° C. to prepare a calcined product.

Next, CuO was appropriately added to the calcined product so that the CuO content in a resultant ceramic sintered product (piezoelectric ceramic composition) was 0 to 0.5 part by weight relative to 100 parts by weight of the main component. Then, three types of samples having different CuO contents were prepared by the same method and procedures as in Example 1 (Sample Nos. 21 to 23).

Then, the pyroelectric coefficient Tp (C/m$^2 \cdot °$C.) and the piezoelectric constant $d_{33}$ were measured by the same method and procedures as in Example 1.

Table 2 shows the CuO content, average pyroelectric coefficient Tp, and average piezoelectric constant $d_{33}$ of each of the samples of Sample Nos. 21 to 23.

TABLE 2

| | Main component composition: $SrBi_2(Nb_{1.9}Ta_{0.1})O_9$ | | |
|---|---|---|---|
| Sample No. | CuO content (part by weight) | Pyroelectric coefficient Tp × 10$^{-4}$ (C/m$^2 \cdot °$C.) | Piezoelectric constant $d_{33}$ (pC/N) |
| 21* | 0 | 1.42 | 17 |
| 22 | 0.05 | 0.93 | 16 |
| 23 | 0.5 | 1.02 | 14 |

*out of the range of the present invention

Table 2 indicates that when CuO is contained in a piezoelectric ceramic composition containing $SrBi_2(Nb_{1.9}Ta_{0.1})O_9$ as a main component, the pyroelectric coefficient Tp is rapidly decreased while the piezoelectric constant is maintained at a practicable level.

Namely, the pyroelectric coefficient Tp in Sample No. 21 not containing CuO is as high as 1.42×10$^{-4}$ (C/m$^2 \cdot °$C.), but in Sample Nos. 22 and 23, the pyroelectric coefficient is suppressed to 1.1×10$^{-4}$ (C/m$^2 \cdot °$C.) or less by adding CuO. Also, it is found that in Sample Nos. 22 and 23, the piezoelectric constant $d_{33}$ is not much decreased.

Comparative Example

The relation between the CuO content and pyroelectric coefficient Tp was examined for a SBTi-type piezoelectric ceramic composition, which is a similar composition type containing a different main component.

Namely, $SrCO_3$, $Bi_2O_3$ TiO were weighed so that the main component composition after sintering satisfied the composition formula $SrBi_4Ti_4O_{15}$. Then, $MnCO_3$ was weighed as a sintering additive so that the content was 0.5 part by weight relative to 100 parts by weight of the main component. The weighed materials were poured into a ball mill together with zirconia balls serving as a milling medium and water, mixed, and wet-milled. Then, after dehydration and drying, the mixture was calcined at a temperature of 800° C. to 1000° C. to prepare a calcined product.

Next, CuO was appropriately added to the calcined product so that the CuO content in a resultant ceramic sintered product (piezoelectric ceramic composition) was 0 to 0.5 part by weight relative to 100 parts by weight of the main component. Then, three types of samples having different CuO contents were prepared by the same method and procedures as in Example 1 (Sample Nos. 31 to 33).

The pyroelectric coefficient Tp (C/m$^2 \cdot °$C.) was calculated by the same method and procedures as in Example 1.

Table 3 shows the CuO content and pyroelectric coefficient Tp of each of the samples of Sample Nos. 31 to 33. FIG. 3 is a plot of a relation between the CuO content and pyroelectric coefficient Tp.

TABLE 3

| | Main component composition: $SrBi_4Ti_4O_{15}$ | |
|---|---|---|
| Sample No. | CuO content (part by weight) | Pyroelectric coefficient Tp × 10$^{-4}$ (C/m$^2 \cdot °$C.) |
| 31* | 0 | 0.49 |
| 32* | 0.05 | 0.51 |
| 33* | 0.5 | 0.78 |

*out of the range of the present invention

Table 3 and FIG. 3 indicate that unlike in a SBN-type piezoelectric ceramic component, the pyroelectric coefficient Tp is decreased by adding CuO in a SBTI-type piezoelectric ceramic composition. Namely, it is confirmed that the action of suppressing the pyroelectric coefficient TP by adding CuO is characteristic of the SBN-type piezoelectric ceramic composition.

The invention claimed is:

1. A piezoelectric ceramic composition comprising a bismuth layer compound containing at least Sr, Bi and Nb as a main component and 0.04 to 0.5 parts by weight of Cu in terms of CuO relative to 100 parts by weight of the main component, wherein the main component represented by the general formula, $Bi_2(Sr_{1-x}M_x)(Nb_{2-y}Ta_y)O_9$ in which M is a monovalent, divalent or trivalent metal, or a combination thereof, $0 \leq x \leq 0.1$ and $0 \leq y \leq 0.1$.

2. The piezoelectric ceramic composition according to claim 1, further comprising 0.1 part by weight to 2 parts by weight of Mn in terms of $MnCO_3$ relative to 100 parts by weight of the main component.

3. The piezoelectric ceramic composition according to claim 1, wherein x and y are 0 whereby the main component is represented by the composition formula $SrBi_2Nb_2O_9$.

4. The piezoelectric ceramic composition according to claim 1, wherein x is greater than 0.

5. The piezoelectric ceramic composition according to claim 1, wherein y is 0.

6. The piezoelectric ceramic composition according to claim 1, wherein y is greater than 0.

7. A piezoelectric ceramic composition comprising a bismuth layer compound containing at least Sr, Bi and Nb as a main component and 2 parts by weight or less (excluding 0 part by weight) of Cu in terms of CuO relative to 100 parts by weight of the main component, wherein the main component represented by the general formula, $Bi_2(Sr_{1-x}M_x)(Nb_{2-y}Ta_y)O_9$ in which M is a monovalent, divalent or trivalent metal, or a combination thereof, $0 \leq x \leq 0.1$ and $0 \leq y \leq 0.1$.

8. The piezoelectric ceramic composition according to claim 7, further comprising 0.1 part by weight to 2 parts by weight of Mn in terms of $MnCO_3$ relative to 100 parts by weight of the main component.

9. The piezoelectric ceramic composition according to claim 7, wherein at least one of x and y are 0.

10. The piezoelectric ceramic composition according to claim 7, wherein x is greater than 0.

11. The piezoelectric ceramic composition according to claim 7, wherein y is greater than 0.

12. A piezoelectric component comprising a ceramic substrate having a pair of main surfaces and an electrode on each main surface, wherein the ceramic substrate comprises a piezoelectric ceramic composition according to claim 7.

13. A piezoelectric component comprising a ceramic substrate having a pair of main surfaces and an electrode on each main surface, wherein the ceramic substrate comprises a piezoelectric ceramic composition according to claim 1.

14. A piezoelectric component comprising a ceramic substrate having a pair of main surfaces and an electrode on each main surface, wherein the ceramic substrate comprises a piezoelectric ceramic composition according to claim 2.

15. A piezoelectric component comprising a ceramic substrate having a pair of main surfaces and an electrode on each main surface, wherein the ceramic substrate comprises a piezoelectric ceramic composition according to claim 3.

16. A piezoelectric component comprising a ceramic substrate having a pair of main surfaces and an electrode on each main surface, wherein the ceramic substrate comprises a piezoelectric ceramic composition according to claim 4.

17. A piezoelectric component comprising a ceramic substrate having a pair of main surfaces and an electrode on each main surface, wherein the ceramic substrate comprises a piezoelectric ceramic composition according to claim 8.

18. A piezoelectric component comprising a ceramic substrate having a pair of main surfaces and an electrode on each main surface, wherein the ceramic substrate comprises a piezoelectric ceramic composition according to claim 9.

19. A piezoelectric component comprising a ceramic substrate having a pair of main surfaces and an electrode on each main surface, wherein the ceramic substrate comprises a piezoelectric ceramic composition according to claim 10.

20. A piezoelectric component comprising a ceramic substrate having a pair of main surfaces and an electrode on each main surface, wherein the ceramic substrate comprises a piezoelectric ceramic composition according to claim 11.

* * * * *